United States Patent
Kelkar et al.

(10) Patent No.: US 11,422,289 B2
(45) Date of Patent: Aug. 23, 2022

(54) ANTI-REFLECTION COATING

(71) Applicant: ASML Holding N.V., Veldhoven (NL)

(72) Inventors: Parag Vinayak Kelkar, Danbury, CT (US); David Hart Peterson, Milford, CT (US)

(73) Assignee: ASML Holding N.V., Veldhoven (NL)

( * ) Notice: Subject to any disclaimer, the term of this patent is extended or adjusted under 35 U.S.C. 154(b) by 401 days.

(21) Appl. No.: 16/500,546

(22) PCT Filed: Mar. 13, 2018

(86) PCT No.: PCT/EP2018/056160
§ 371 (c)(1),
(2) Date: Oct. 3, 2019

(87) PCT Pub. No.: WO2018/184793
PCT Pub. Date: Oct. 11, 2018

(65) Prior Publication Data
US 2020/0103558 A1 Apr. 2, 2020

Related U.S. Application Data

(60) Provisional application No. 62/481,548, filed on Apr. 4, 2017.

(51) Int. Cl.
*G02B 1/111* (2015.01)
*G03F 7/20* (2006.01)

(52) U.S. Cl.
CPC .......... *G02B 1/111* (2013.01); *G03F 7/70941* (2013.01); *G03F 7/70958* (2013.01); *G02B 2207/109* (2013.01)

(58) Field of Classification Search
None
See application file for complete search history.

(56) References Cited

U.S. PATENT DOCUMENTS

| 4,273,826 A | 6/1981 | McCollister et al. |
| 6,344,288 B1 | 2/2002 | Oyama et al. |

(Continued)

FOREIGN PATENT DOCUMENTS

| CN | 101315431 A | 12/2008 |
| CN | 101315461 A | 12/2008 |

(Continued)

OTHER PUBLICATIONS

International Search Report and Written Opinion of the International Searching Authority directed to related International Patent Application No. PCT/EP2018/056160, dated Jun. 18, 2018; 8 pages.

(Continued)

*Primary Examiner* — Derek S. Chapel
(74) *Attorney, Agent, or Firm* — Sterne, Kessler, Goldstein & Fox P.L.L.C.

(57) ABSTRACT

A method of forming an anti-reflection layer, the method including applying a first mixture to an object, the first mixture made from a combination of aluminum tri-sec-butoxide (ATSB), a first chelating agent, water and an alcohol; removing a majority of the alcohol from the applied first mixture; after the removing, applying a second mixture to the object, the second mixture made from a combination of aluminum tri-sec-butoxide, a second chelating agent different than the first chelating agent, water and an alcohol; and removing a majority of the alcohol from the applied second mixture, wherein the applied first and second mixtures are used to form the anti-reflection layer.

15 Claims, 8 Drawing Sheets

(56) References Cited

U.S. PATENT DOCUMENTS

| | | |
|---|---|---|
| 8,512,801 B2 | 8/2013 | Yoshihara et al. |
| 9,939,556 B2 | 4/2018 | Schulz et al. |
| 2001/0028983 A1 | 10/2001 | Kawamura et al. |
| 2007/0048509 A1* | 3/2007 | Yoneyama ......... G02B 27/0006 428/212 |
| 2008/0066855 A1 | 3/2008 | Alger |
| 2008/0192350 A1 | 8/2008 | Yamada et al. |
| 2009/0176084 A1 | 7/2009 | Yoshihara et al. |
| 2009/0176107 A1 | 7/2009 | Sharma |
| 2010/0124643 A1 | 5/2010 | Lu et al. |
| 2010/0189971 A1 | 7/2010 | Isono et al. |
| 2010/0208353 A1 | 8/2010 | Okuno |
| 2011/0133138 A1* | 6/2011 | Kim .................... C09D 183/04 252/588 |
| 2011/0151222 A1 | 6/2011 | Oudard et al. |
| 2013/0258480 A1 | 10/2013 | Makino et al. |
| 2015/0175814 A1 | 6/2015 | Aizenberg et al. |
| 2016/0216409 A1 | 7/2016 | Schulz et al. |

FOREIGN PATENT DOCUMENTS

| | | |
|---|---|---|
| EP | 0994368 A2 | 4/2000 |
| JP | 2000-357765 A | 12/2000 |
| JP | 2001-337441 A | 12/2001 |
| JP | 2004-212619 A | 7/2004 |
| JP | 2007-213780 A | 8/2007 |
| JP | 2007-246877 A | 9/2007 |
| JP | 2008-083682 A | 4/2008 |
| JP | 2009-053691 A | 3/2009 |
| JP | 2010-134002 A | 6/2010 |
| JP | 2011-028277 | 2/2011 |
| JP | 2012-008158 A | 1/2012 |
| JP | 2016-139138 A | 8/2016 |
| WO | WO 99/44080 A1 | 9/1999 |

OTHER PUBLICATIONS

International Preliminary Report on Patentability directed to related International Patent Application No. PCT/EP2018/056160, dated Oct. 8, 2019; 6 pages.

* cited by examiner

ANTI-REFLECTION COATING

CROSS-REFERENCE TO RELATED APPLICATIONS

This application claims priority of U.S. Provisional Patent Application No. 62/481,548, which was filed on Apr. 4, 2017, and which is incorporated herein in its entirety by reference.

FIELD

The present description generally relates to an anti-reflection coating, and more particularly to an anti-reflection coating for optical elements.

BACKGROUND

Manufacturing devices, such as semiconductor devices, typically involves processing a substrate (e.g., a semiconductor wafer) using a number of fabrication processes to form various features and often multiple layers of the devices. Such layers and/or features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a pattern transfer step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching the pattern by an etch apparatus, etc. Further, one or more metrology processes are involved in the patterning process.

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Further, metrology processes are used at various steps during a patterning process to monitor and/or control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), one or more variables of the patterning process may be designed or altered, e.g., based on the measurements of the one or more characteristics, such that substrates manufactured by the patterning process have an acceptable characteristic(s). Many of these metrology processes typically involve providing radiation incident onto various surfaces.

Once such example of metrology is alignment. As part of the patterning process, different processing steps may require different layers to be sequentially formed on the substrate. Accordingly, it may be necessary to position the substrate relative to prior patterns formed thereon with a high degree of accuracy. Generally, alignment marks are placed on the substrate to be aligned and are located with reference to a second object. An alignment system of, e.g., a lithographic apparatus can be used to detect positions of the alignment marks (e.g., X and Y position) and to align the substrate using the alignment marks to help ensure accurate exposure from a patterning device. Alignment systems typically have their own illumination system and detection system.

Another example of metrology is level sensing. As part of the patterning process, a processing step may require a layer to be formed on the substrate at or near focus of the lithographic apparatus. Accordingly, it may be necessary to position the substrate relative to the focus and/or to adjust the focus near a certain level of the substrate, with a high degree of accuracy. So, a level sensor can be provided to determine the height and/or orientation of the substrate relative to the projection system. In an embodiment, this is done by projecting one or more beams of radiation at a tilt angle to the substrate and capturing the reflected radiation. The detected reflected radiation can be used to determine the height (e.g. in Z) and/or orientation (e.g., rotation about X or Y) of the substrate. Those results can then be used to control the position the substrate relative to the focus and/or to adjust the focus relative to the substrate. A level sensor typically has its own illumination system and detection system.

Illumination systems used to determine alignment and/or height typically can provide a range of radiation wavelengths.

SUMMARY

So, while many of the apparatuses and processes of a patterning process involve radiation, radiation can become located in unwanted areas after unintended reflections. Accordingly, an anti-reflection coating can be applied to any of a number of different objects in a patterning process (e.g., a part of a lithographic apparatus, a part of an alignment system, level sensor or other metrology tool, etc.). For example, an anti-reflection coating may be located on various objects (e.g., an exposed area of an optical element to reduce unwanted reflection, a wall, etc.) within a lithographic or metrology apparatus to help eliminate stray radiation.

In an embodiment, there is provided a method of forming an anti-reflection layer, the method comprising: applying a first mixture to an object, the first mixture made from a combination comprising aluminum tri-sec-butoxide (ATSB), a first chelating agent, water and an alcohol; removing a majority of the alcohol from the applied first mixture; after the removing, applying a second mixture to the object, the second mixture made from a combination comprising aluminum tri-sec-butoxide, a second chelating agent different than the first chelating agent, water and an alcohol; and removing a majority of the alcohol from the applied second mixture, wherein the applied first and second mixtures are used to form the anti-reflection layer.

This section is for the purpose of summarizing and to briefly introduce an embodiment. Simplifications or omissions may be made to avoid obscuring the purpose of the section. Such simplifications or omissions are not intended to limit the scope of the present invention. Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the relevant art(s) to make and use the invention.

Figure 1:
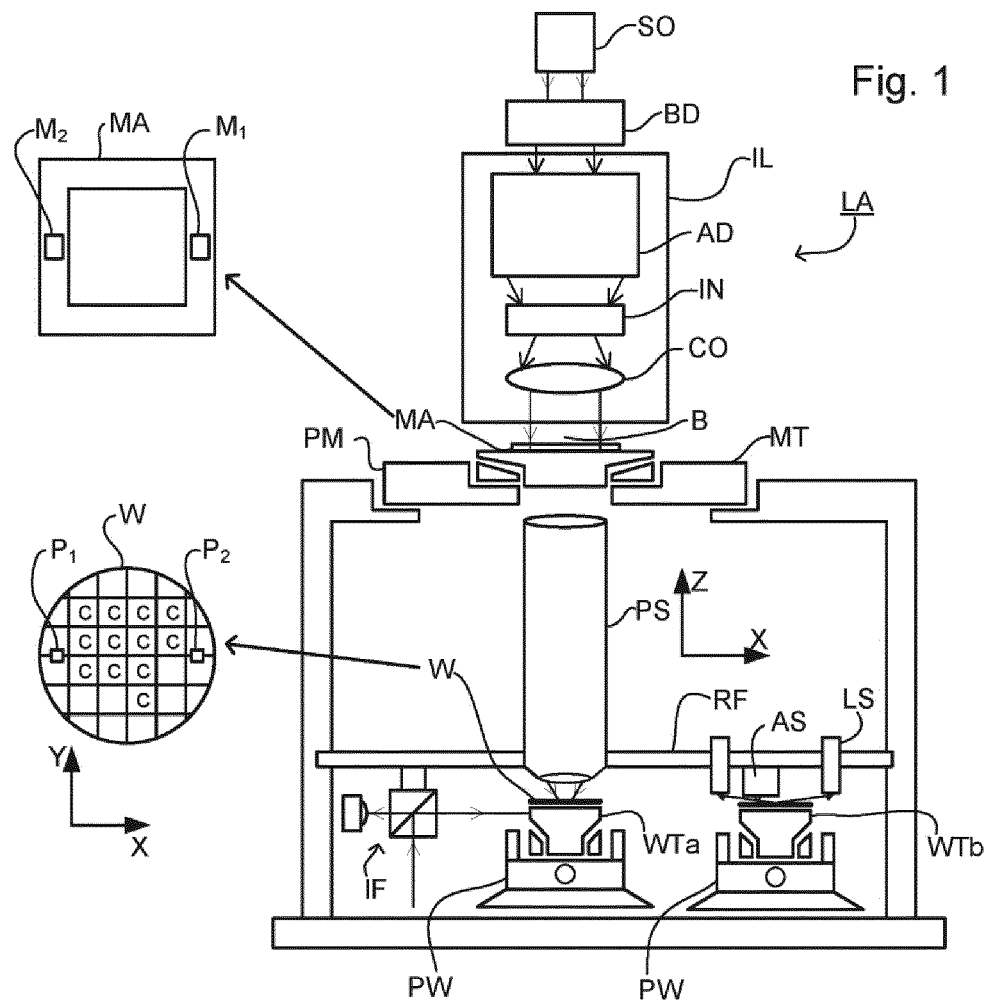
FIG. 1 depicts an embodiment of a lithographic apparatus.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

Before describing embodiments in detail, it is instructive to present an example environment in which embodiments may be implemented.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted minors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask). In an embodiment, where the apparatus is of a reflective type, the projection system may consist mainly of reflective optical elements (minors).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using patterning device alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features. The alignment system, which detects the alignment markers, is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out.

To facilitate, e.g., control of the exposure of the substrate, a surface of substrate may be inspected to determine its height by an optical level sensor LS. With a known height, the relative position between the substrate and projection optical system can be controlled to, e.g., help place or maintain the substrate in the focus of the projection system.

Further, to facilitate, e.g., control of the exposure of the substrate, the position of alignment markers on the substrate and/or substrate table can be measured using an optical alignment sensor AS. With a known position of the alignment mark at the substrate and/or substrate table, the pattern from a patterning device can be relatively accurately placed on a desired location on the substrate.

In an embodiment, this height measurement and/or alignment measurement of a substrate and/or substrate table can take place at a measurement station prior to exposure of the substrate. This can enable a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the embodiments of the present invention.

Figure 2:
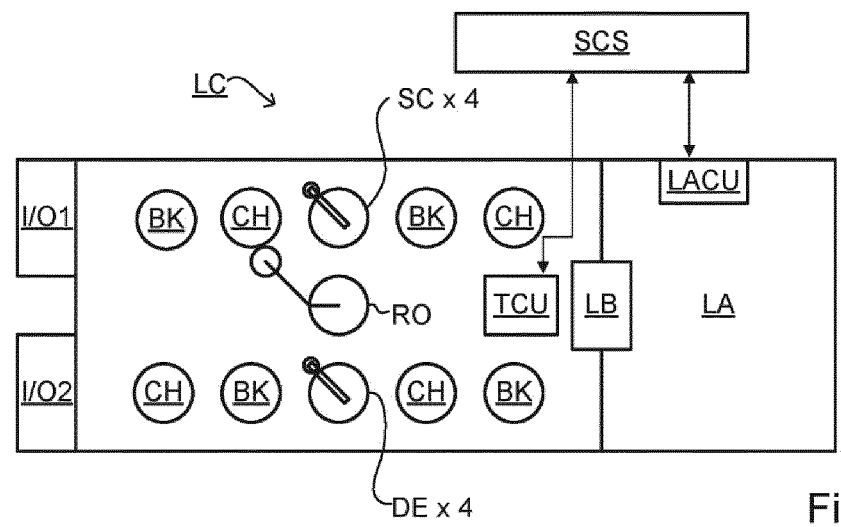
FIG. 2 depicts an embodiment of a lithographic cell or cluster.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order to design, monitor, control, etc. the patterning process (e.g., a device manufacturing process) that includes at least one patterning step (e.g., an optical lithography step), the patterned substrate can be inspected and one or more parameters of the patterned substrate are measured. The one or more parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on a substrate. There are various techniques for making measurements of the structures formed in the patterning process, including the use of a scanning electron microscope, image-based measurement or inspection tools and/or various specialized tools. A relatively fast and non-invasive form of specialized metrology and/or inspection tool is one in which a beam of radiation is directed onto a target on the surface of the substrate and properties of the scattered (diffracted/reflected) beam are measured. By comparing one or more properties of the beam before and after it has been scattered by the substrate, one or more properties of the substrate can be determined. This may be termed diffraction-based metrology or inspection.

Figure 3:
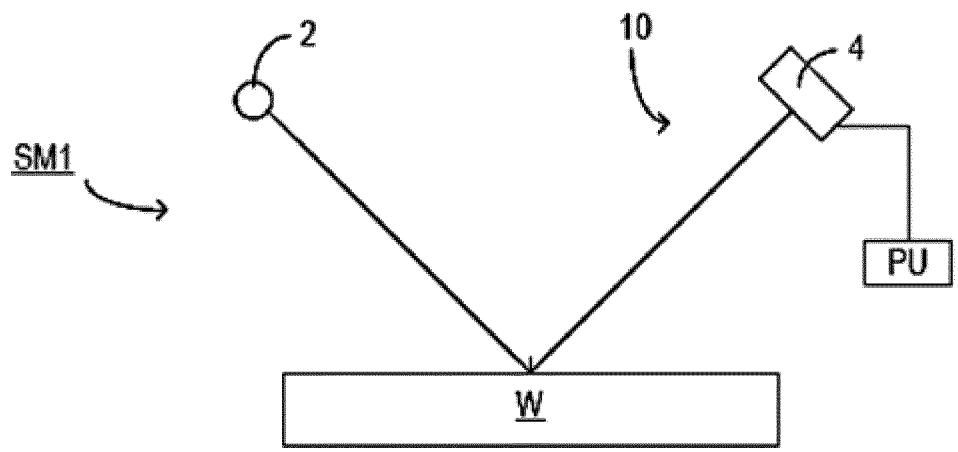
FIG. 3 schematically depicts an example inspection apparatus and metrology technique.
Figure 3:
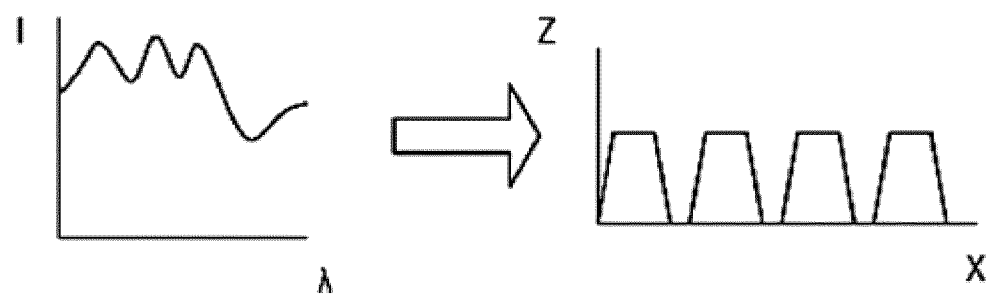

FIG. 3 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figure 4:
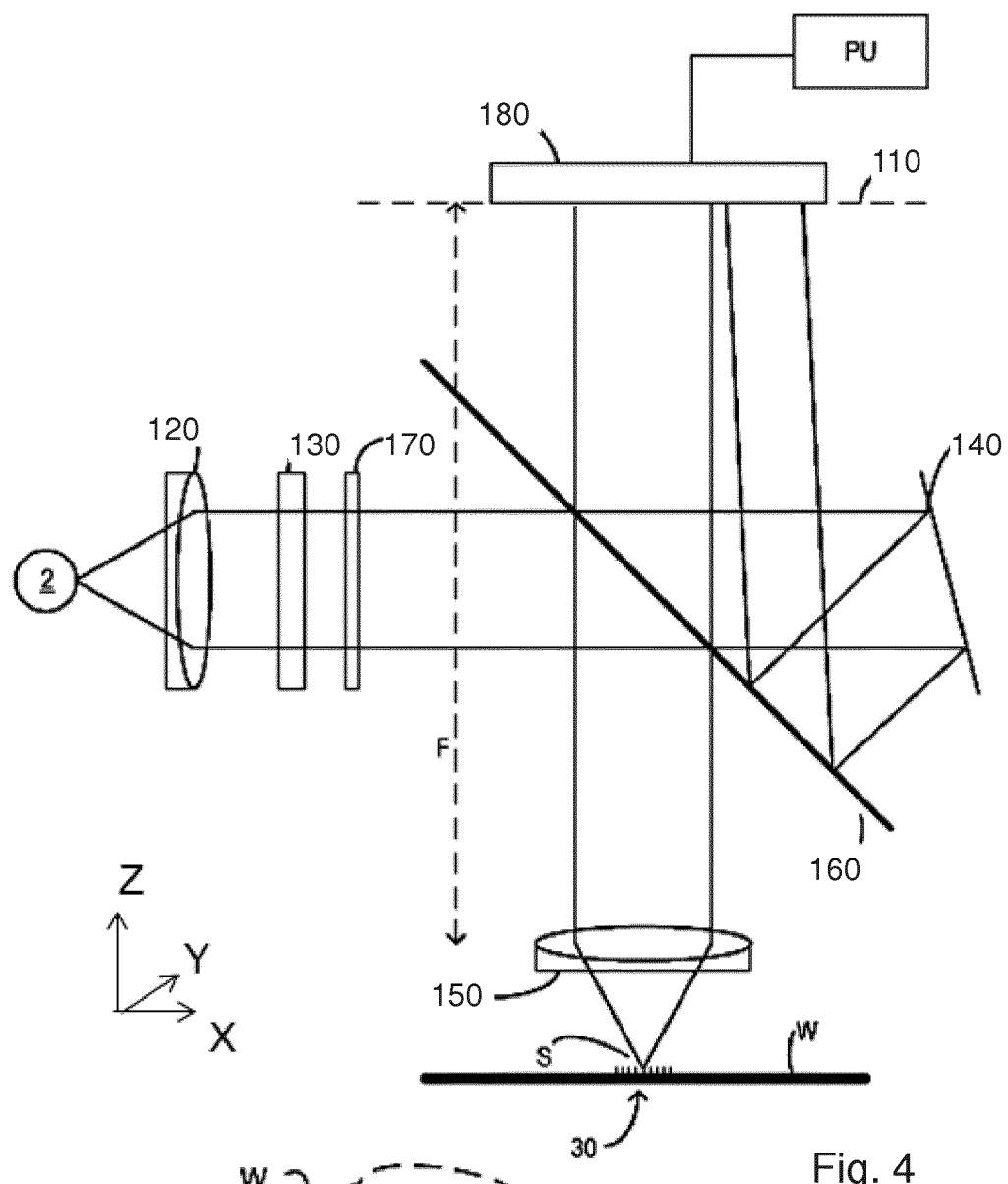
FIG. 4 schematically depicts an example inspection apparatus.

Another inspection apparatus that may be used is shown in FIG. 4. In this device, the radiation emitted by radiation source 2 is collimated using lens system 120 and transmitted through interference filter 130 and polarizer 170, reflected by partially reflecting surface 160 and is focused into a spot S on substrate W via an objective lens 150, which has a high numerical aperture (NA), desirably at least 0.9 or at least 0.95. An immersion inspection apparatus (using a relatively high refractive index fluid such as water) may even have a numerical aperture over 1.

The radiation redirected by the substrate W then passes through partially reflecting surface 160 into a detector 180 in order to have the spectrum detected. The detector 180 may be located at a back-projected focal plane 110 (i.e., at the focal length of the lens system 150) or the plane 110 may be re-imaged with auxiliary optics (not shown) onto the detector 180. The detector may be a two-dimensional detector so that a two-dimensional angular scatter spectrum of a substrate target 30 can be measured. The detector 180 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 160 part of it is transmitted through the partially reflecting surface 160 as a reference beam towards a reference minor 140. The reference beam is then projected onto a different part of the same detector 180 or alternatively on to a different detector (not shown).

One or more interference filters 130 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 180 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

Figure 5:
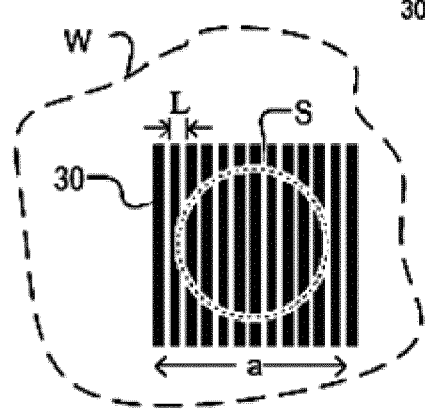
FIG. 5 illustrates the relationship between an illumination spot of an inspection apparatus and a metrology target.

FIG. 5 illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 120, 130, 170 may be configured to provide illumination of a uniform intensity across a back focal plane of objective 150. Alternatively, by, e.g., including an aperture in the illumination path, illumination may be restricted to on axis or off axis directions.

In addition to measurement of a parameter by reconstruction, diffraction-based metrology or inspection can be used in the measurement of asymmetry of features in product and/or resist patterns. A particular application of asymmetry measurement is for the measurement of overlay, for example, but other applications are also known. In this case, the target 30 typically comprises one set of periodic features superimposed on another. For example, asymmetry can be measured by comparing opposite parts of the diffraction spectrum from the target 30 (for example, comparing the $-1$st and $+1^{st}$ orders in the diffraction spectrum of a periodic grating). The concepts of asymmetry measurement using the instrument of FIG. 3 or FIG. 4 are described, for example, in U.S. patent application publication US2006-066855, which is incorporated herein in its entirety by reference. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 180 may be an image sensor, such asymmetry in the diffraction orders appears directly as asymmetry in the pupil image recorded by detector 180. This asymmetry can be measured by digital image processing in unit PU, and calibrated against known values of overlay.

Figure 6A:
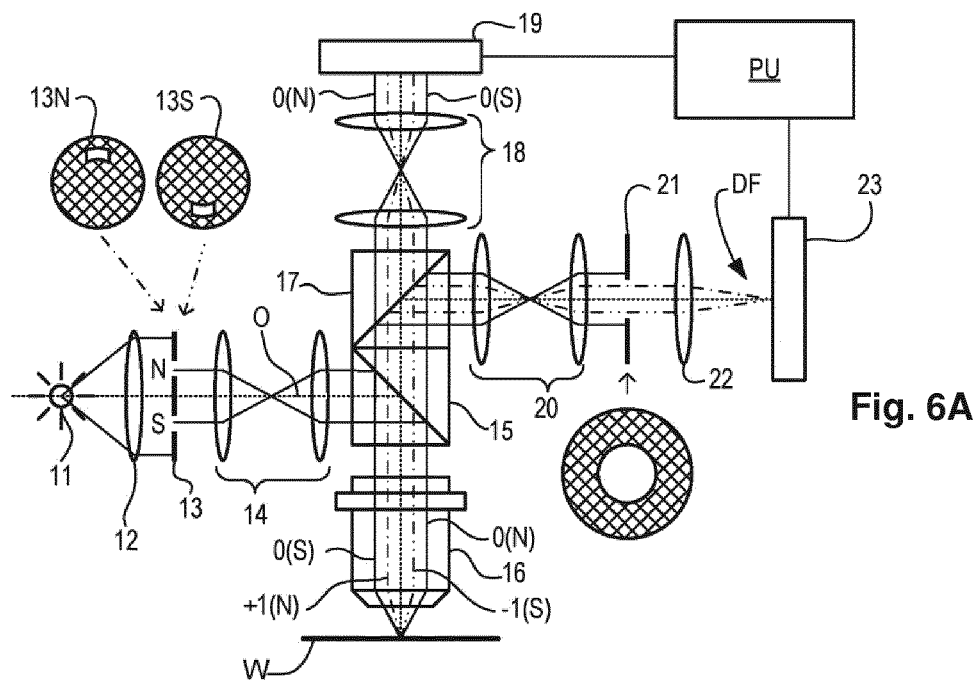
FIG. 6A depicts a schematic diagram of an inspection apparatus configured to measure a target.

A further inspection apparatus suitable for use in embodiments is shown in FIG. 6A. A target T and diffracted rays of measurement radiation used to illuminate the target are illustrated in more detail in FIG. 6B. The inspection apparatus illustrated is of a type known as a dark field metrology apparatus. The inspection apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by source 11 (e.g., a xenon lamp) is directed onto substrate W via optical element 15 by an optical system comprising lenses 12, 14 and objective lens 16. These lenses are arranged in a double sequence of a 4F arrangement. A different lens arrangement can be used, provided that it, e.g., provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis radiation from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode will interfere with the desired measurement signals.

Figures 6B, 6C, 6D:
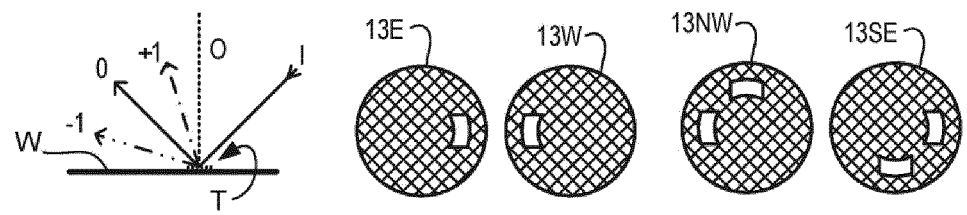
FIG. 6B schematically depicts a detail of a diffraction spectrum of a target periodic structure for a given direction of illumination.
FIG. 6C schematically depicts illumination apertures for providing further illumination modes in using the inspection apparatus of FIG. 6A for diffraction based measurements.
FIG. 6D schematically depicts further illumination apertures for use in the inspection apparatus of FIG. 6A.

As shown in FIG. 6B, target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitches of the targets and the illumination angles can be designed or adjusted so that the first order rays entering the objective lens are closely aligned with the central optical axis. The rays illustrated in FIGS. 6A and 6B are shown somewhat off axis, purely to enable them to be more easily distinguished in the diagram.

At least the 0 and +$1^{st}$ orders diffracted by the target T on substrate W are collected by objective lens 16 and directed back through optical element 15. Returning to FIG. 6A, both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the inspection apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the periodic structure features as such will not be formed, if only one of the −$1^{st}$ and +$1^{st}$ orders is present.

The particular forms of aperture plate 13 and field stop 21 shown in FIGS. 6A, 6C and 6D are purely examples. In an embodiment, on-axis illumination of the targets is used and an aperture stop with an off-axis aperture is used to pass substantially only one first order of diffracted radiation to the sensor. In yet other embodiments, 2nd, 3rd and higher order beams (not shown in FIG. 6A, 6B, 6C or 6D) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure periodic structures oriented in one direction (X or Y depending on the set-up). For measurement of an orthogonal periodic structure, rotation of the target through 90° and 270° might be implemented. Different aperture plates are shown in FIGS. 6C and 6D. The use of these, and numerous other variations and applications of the apparatus are described in the patent application publications mentioned above.

Figure 7:
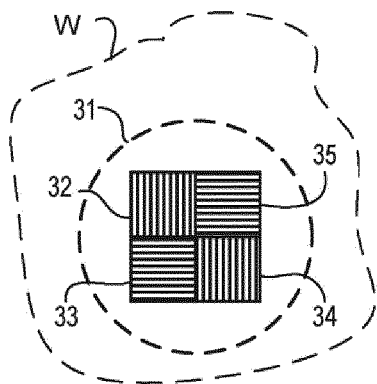
FIG. 7 depicts a form of multiple periodic structure target and an outline of a measurement spot on a the target.

FIG. 7 depicts a (composite) target formed on a substrate according to known practice. The target in this example comprises four periodic structures (e.g., gratings) 32 to 35 positioned closely together so that they will all be within a measurement spot 31 formed by the metrology radiation illumination beam of the inspection apparatus. The four periodic structures thus are all simultaneously illuminated and simultaneously imaged on sensors 19 and 23. In an example dedicated to measurement of overlay, periodic structures 32 to 35 are themselves composite periodic structures formed by overlying periodic structures that are patterned in different layers of, e.g., the semi-conductor device formed on substrate W. Periodic structures 32 to 35 may have differently biased overlay offsets in order to facilitate measurement of overlay between the layers in which the different parts of the composite periodic structures are formed. The meaning of overlay bias will be explained below with reference to FIG. 7. Periodic structures 32 to 35 may also differ in their orientation, as shown, so as to diffract incoming radiation in X and Y directions. In one example, periodic structures 32 and 34 are X-direction periodic structures with bias offsets of +d, −d, respectively. Periodic structures 33 and 35 are Y-direction periodic structures with bias offsets +d, −d respectively. Separate images of these periodic structures can be identified in the image captured by sensor 23. This is only one example of a target. A target may comprise more or fewer than 4 periodic structures, or only a single periodic structure.

Figure 8:
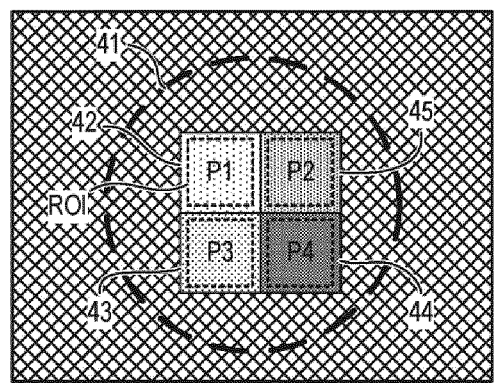
FIG. 8 depicts an image of the target of FIG. 7 obtained in the inspection apparatus of FIG. 6A.

FIG. 8 shows an example of an image that may be formed on and detected by the sensor 23, using the target of FIG. 7 in the apparatus of FIG. 6, using the aperture plates 13NW or 13SE from FIG. 6D. While the pupil plane image sensor 19 cannot resolve the different individual periodic structures 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target periodic structures 32 to 35. If the targets are located in product areas, product features may also be visible in the periphery of this image field. Image processor and control system PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the patterning process. Overlay performance is an important example of such a parameter.

As noted above, a lithographic apparatus (including any optical metrology apparatus therein such as the alignment sensor, level sensor, interferometer, etc.) as described herein, an inspection apparatus as described herein, any articles for use with any of the apparatus described herein (e.g., a device substrate, a patterning device, etc.) can make use of, or be subject to, radiation. However, it is often desired, for example, that the radiation only reach certain parts. So, anti-reflection coatings are often used to help prevent unwanted radiation (e.g., stray radiation).

An anti-reflection coating is often deposited on a surface by physical vapor deposition. However, a coating formed in this manner often has a relatively limited wavelength bandwidth (e.g. 450-700 nm for visible applications) and a relatively limited angle of incidence range (0 to 30 degrees) for radiation incident on the coating, for the coating is effective to have reflectance of less than or equal to 1% or less than or equal to 0.5%.

So, there is provided herein an anti-reflection coating, and a method of depositing the anti-reflection coating, that can provide low reflectance of less than or equal to 1% or less than or equal to 0.5% over, e.g., a broader wavelength range (e.g., the low reflectance over a majority, if not all, of the range of 300-1200 nm) and/or larger angle of incidence range (e.g., the low reflectance over a majority, if not all, of the range of 0°-55° incidence angle that are common in, e.g., a lithographic apparatus or metrology tool).

In an embodiment, the anti-reflection coating is a graded refractive index anti-reflection coating wherein the refractive index changes from the substrate refractive index to the incident medium (typically air) refractive index in a substantially monotonic fashion. Such an anti-reflection can have close to 0% reflection over a wide wavelength band and over a wide angle of incidence range.

In an embodiment, there is provided an aluminum oxide graded index anti-reflection coating. In an embodiment, as described further herein, the aluminum oxide graded index anti-reflection coating is created by sol-gel process.

Figure 9:
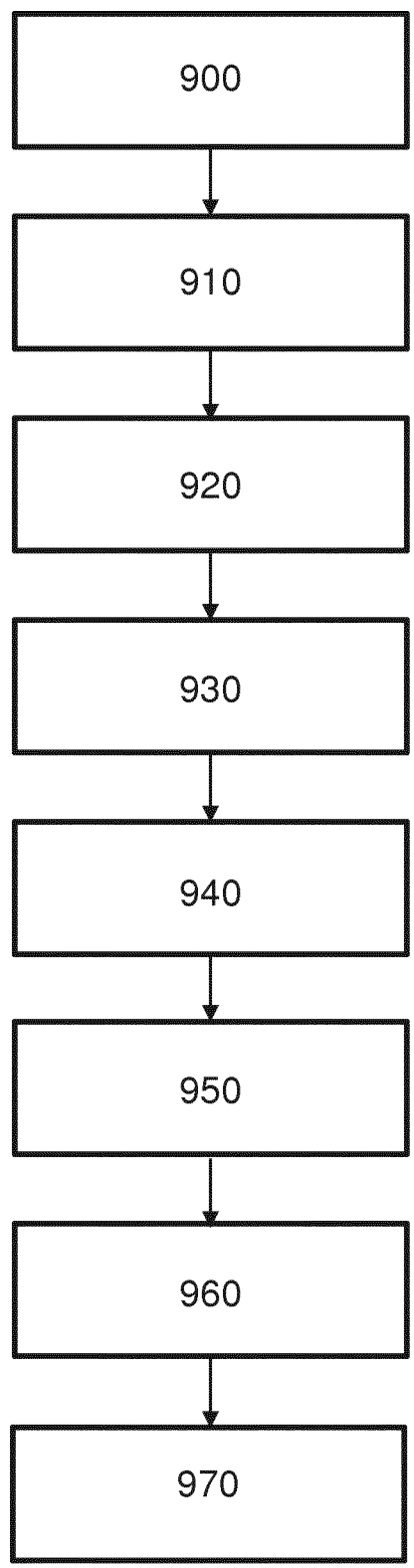
FIG. 9 is a flowchart of an embodiment of a method of forming an anti-reflection coating.
Figure 10A:
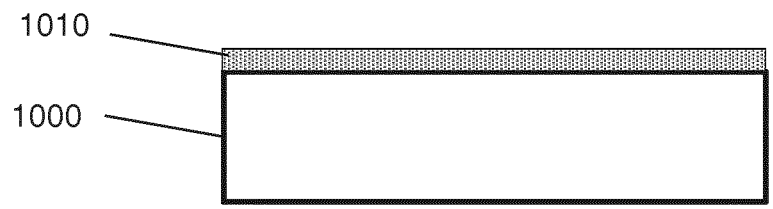
FIGS. 10A, 10B and 10C are highly schematic depictions of a physical implementation of the method.
Figure 10B:
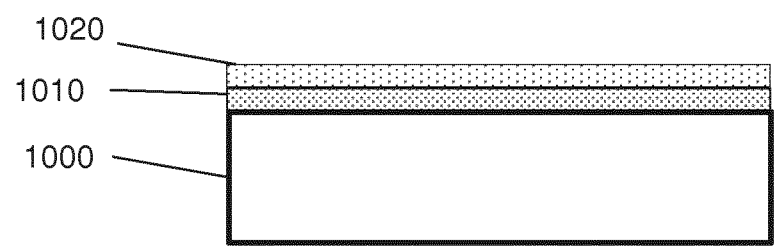
Figure 10C:
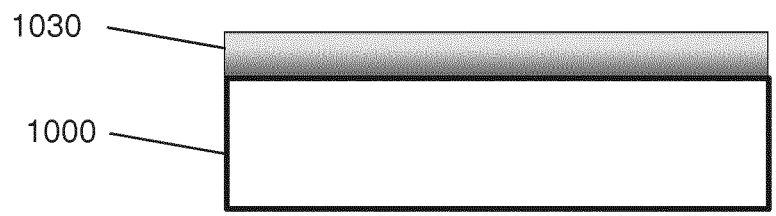

FIG. 9 describes an example embodiment of a process of creating an aluminum oxide graded index anti-reflection coating. FIGS. 10A, 10B and 10C are highly schematic depictions of a physical implementation of the method.

At 900, a first mixture is formed. In an embodiment, the first mixture is a solution. In an embodiment, the first mixture comprises aluminum tri-sec-butoxide (ATSB), a chelating agent, alcohol and water. So, in an embodiment, the second mixture comprises aluminum hydrous oxide. In an embodiment, the alcohol is isopropyl alcohol (IPA). In an embodiment, the chelating agent is acetylacetone (AcAcH). In an embodiment, the ATSB to water molar ratio is selected from about 1:2 to about 1:4. In an embodiment, the first mixture has a molar ratio of about ATSB:AcAcH:$H_2O$:IPA :: about 1:1:2:20.

In an embodiment of preparing the first mixture, aluminum tri-sec-butoxide (ATSB) is mixed with an alcohol (e.g., IPA) to form an ATSB mix for the first mixture. In an embodiment, the ATSB is mixed with the alcohol (e.g., IPA) in about a 1:5 molar ratio. Further, a chelating agent (e.g., AcAcH) is mixed with alcohol (e.g., IPA) to form a chelating agent mix for the first mixture. In an embodiment, the chelating agent (e.g., AcAcH) is mixed with the alcohol (e.g., IPA) in about a 1:15 molar ratio. Then, the first mixture chelating agent mix is combined with the first mixture ATSB mix, along with water. In an embodiment, water is added to obtain an ATSB to water molar ratio selected from about 1:2 to about 1:4.

In an embodiment, a precipitate is formed in the first mixture when aluminum tri-sec-butoxide (ATSB), a chelating agent, alcohol and water is combined. In an embodiment, nitric acid is added until a relatively clear solution is obtained.

At 910, a second mixture is formed. In an embodiment, the second mixture is a solution. In an embodiment, the second mixture comprises aluminum tri-sec-butoxide (ATSB), a chelating agent, alcohol and water. So, in an embodiment, the second mixture comprises aluminum hydrous oxide. In an embodiment, the alcohol is isopropyl alcohol (IPA). In an embodiment, the chelating agent of the second mixture is different than the chelating agent of the first mixture. In an embodiment, the particles within the second mixture are on average smaller (e.g., maximum dimension) than the particles within the first mixture. In an embodiment, the chelating agent is ethyl acetoacetate (EAA). In an embodiment, the ATSB to water molar ratio is selected from about 1:2 to about 1:4. In an embodiment, the second mixture has a molar ratio of about ATSB:EAA:$H_2O$:IPA :: about 1:1:2:20.

In an embodiment of preparing the second mixture, aluminum tri-sec-butoxide (ATSB) is mixed with an alcohol to form an ATSB mix for the second mixture. In an embodiment, the ATSB is mixed with the alcohol (e.g., IPA) in about a 1:5 molar ratio. Further, a chelating agent (e.g., EAA) is mixed with alcohol (e.g., IPA) to form a chelating agent mix for the second mixture. In an embodiment, the chelating agent (e.g., EAA) is mixed with the alcohol (e.g., IPA) in about a 1:5 molar ratio. Then, the second mixture chelating agent mix is combined with the second mixture ATSB mix, along with water. In an embodiment to add the water, water is mixed with the alcohol (e.g., IPA) to obtain a water solution. In an embodiment, the water solution has water and IPA in about a 1:5 molar ratio. The water solution is added to a combination of the second mixture chelating agent mix and the second mixture ATSB mix. So, the second mixture is formed by the combination of the second mixture chelating agent mix, the second mixture ATSB mix and the water solution.

In an embodiment, the first and/or second mixture can be created automatically by using a system that has one or more dispensers to dispense the appropriate amount of materials into appropriate containers to form the first and/or second mixtures. Such dispensing and forming can be controlled by an appropriate control system and/or software.

At 920 and referring to FIG. 10A, the first mixture 1010 is applied to an object 1000. In an embodiment, the object is a structure of a glass or glass-like material. In an embodiment, the object comprises fused silica. In an embodiment, the first mixture is applied by spin coating. In an embodiment, the spin coating is at about 5000 rpm or more for about 30 seconds or more. In an embodiment, the first mixture is applied by dip coating. In an embodiment, the first mixture comprises acetylacetone (AcAcH). In an embodiment, the first mixture can be applied automatically by using a system to perform the application of the first mixture, e.g., a spin coater and/or a dip coating apparatus controlled by an appropriate control system and/or software.

At 930, a majority of the alcohol is removed from the applied first mixture. In an embodiment, after removal of the alcohol, the applied first mixture is in a gel state. In an embodiment, such removal comprises baking of the applied first mixture at a temperature above 50° C. In an embodiment the applied first mixture is baked at at least 180° C. for at least one hour. In an embodiment, the majority of the alcohol can be removed automatically by using, e.g., a baking system controlled by an appropriate control system and/or software.

At 940, the second mixture 1020 is applied to the object 1000 and onto the applied first mixture 1010 on the object. In an embodiment, the second mixture is applied on the applied first mixture having the majority of its alcohol removed. Advantageously, the creation of the anti-reflection layer is by coating in two steps to obtain the desired thickness. It has been discovered that such a two-step coating process can substantially reduce cracking and/or striations compared to a single step coating process.

In an embodiment, the second mixture is applied by spin coating. In an embodiment, the spin coating is at about 5000 rpm or more for about 30 seconds or more. In an embodiment, the second mixture is applied by dip coating. In an embodiment, the second mixture comprises ethyl acetoacetate (EAA). In an embodiment, the second mixture can be applied automatically by using a system to perform the application of the second mixture, e.g., a spin coater and/or a dip coating apparatus controlled by an appropriate control system and/or software.

At 950, a majority of the alcohol is removed from the applied second mixture. In an embodiment, after removal of the alcohol, the applied first mixture is in a gel state. In an embodiment, such removal comprises baking of the applied second mixture at a temperature above 50° C. In an embodiment the applied second mixture is baked at at least 180° C. for at least one hour. In an embodiment, the majority of the alcohol can be removed automatically by using, e.g., a baking system controlled by an appropriate control system and/or software.

At 960, water is applied to the first and second mixtures on the object. In an embodiment, the applied first and second mixtures are provided in, or arranged to contact, a water bath. In an embodiment, the water has a temperature of at least 50° C. In an embodiment, water of at least 80° C. is applied for at least 20 minutes. In an embodiment, the water can be applied automatically by using a system to perform the application of the water, e.g., a water bath and a mechanical device controlled by an appropriate control system and/or software to place the object in the water bath.

At 970, after the application of the water at 960, the object with the applied first and second mixture is dried. In an embodiment, the object is rinsed with water or alcohol before drying. In an embodiment, the object is dried at a temperature at temperature above 100° C. In an embodiment, the drying can be performed automatically by using, e.g., a baking system controlled by an appropriate control system and/or software.

In an embodiment, the process results in an anti-reflection thin film coating 1030 of aluminum oxide that has a graded index structure (represented by the graded fill of the layer 1030 in FIG. 10C). In an embodiment, the graded index structure provides an index matching between the object and the environment above the coating 1030. In an embodiment, the graded index structure monotonically changes in refractive index. In an embodiment, the graded index structure continuously changes in refractive index.

In an embodiment, the anti-reflection thin film coating forms effectively a single layer of aluminum oxide. That is, in embodiment, there is no discontinuity at the meeting location of the first and second mixtures. In an embodiment, the aluminum oxide forms a crystalline or web-like structure that has a local density variation through the layer such that the layer is more dense (e.g., more aluminum oxide per unit volume than gas) near the object and less dense (e.g., less aluminum oxide per unit volume than gas) at the opposite side (e.g., a gas or vacuum side).

In an embodiment, the anti-reflection coating has a thickness of at least 300 nm. In an embodiment, the first and second mixtures can have equal thickness or different thickness. By the two step process, anti-reflection coating can be substantially crack-free and/or striation-free. In an embodiment, the thickness of the anti-reflection coating is selected dependent on the refractive index of the object. For example, if the refractive index is greater than fused silica (e.g., about 1.45) or less than fused silica, one or more dielectric layers can be interposed between the object and the first mixture so as to achieve an index matching between the object and the first mixture.

Figure 11:
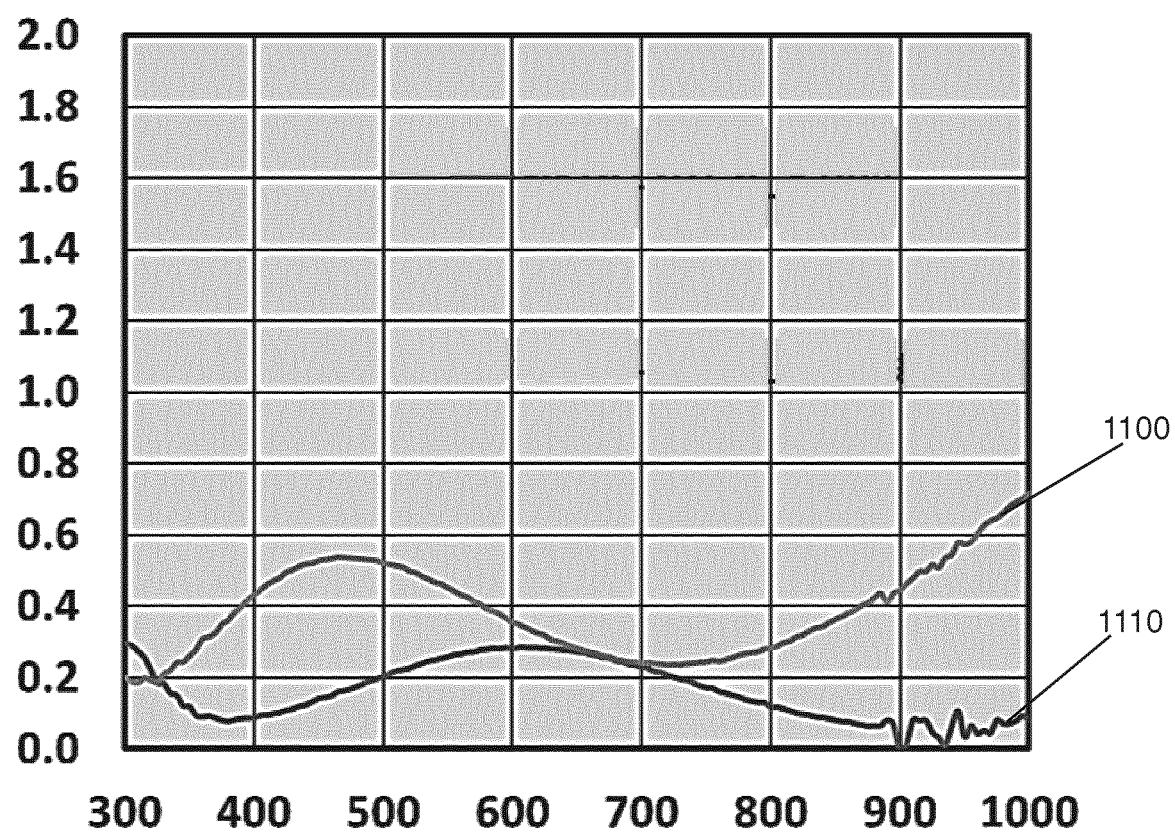
FIG. 11 is a graph of reflectance against wavelength of radiation incident on an anti-reflection coating according to an embodiment.
Figure 12:
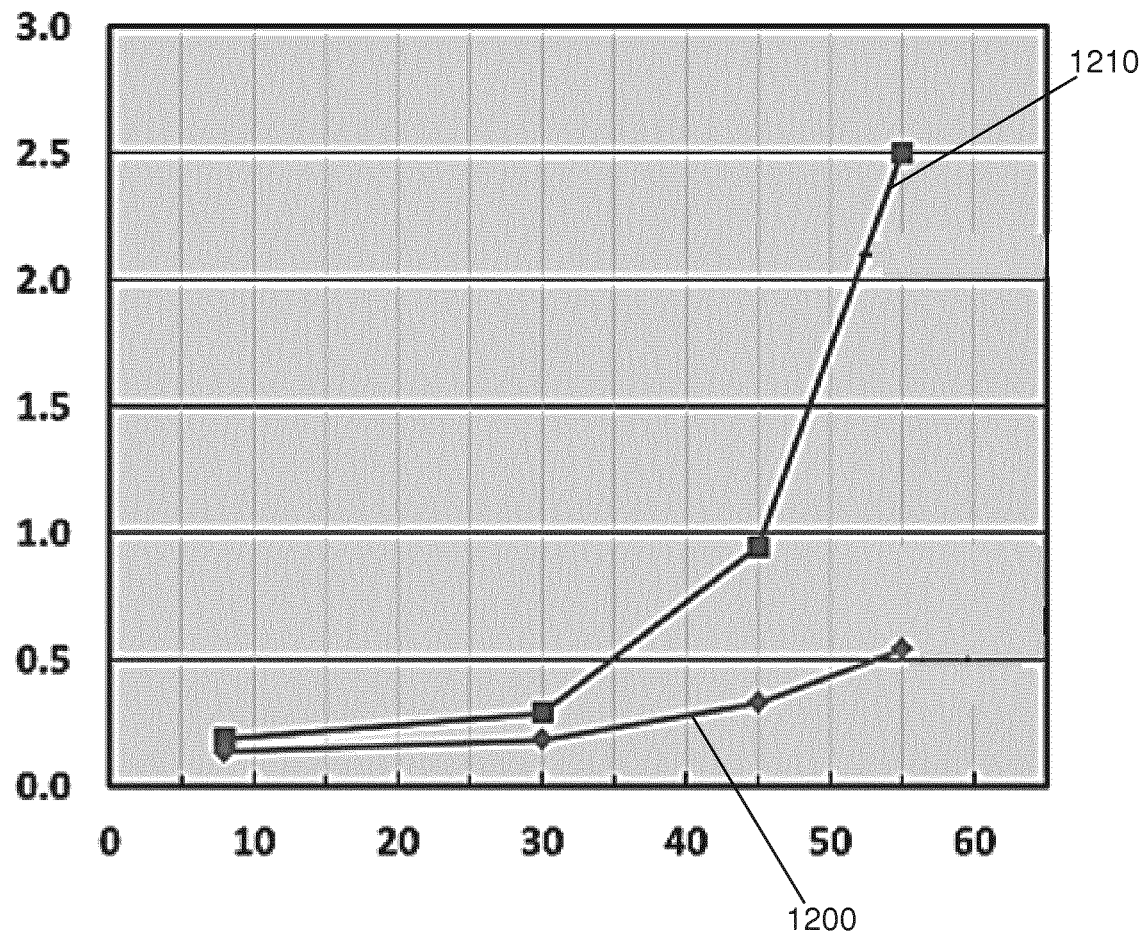
FIG. 12 is a graph of reflectance against incident angle of radiation on an anti-reflection coating according to an embodiment.

In an embodiment, the anti-reflection layer has a reflectance of less than or equal to 1%. In an embodiment, the anti-reflection layer has the reflectance of less than or equal to 1% over a majority of the wavelength range of 300 nm to 1200 nm. In an embodiment, the anti-reflection layer has reflectance of less than or equal to 0.3% over a majority (e.g., all) of the wavelength range of 300 nm to 1000 nm at normal incidence. In an embodiment, the anti-reflection layer has the reflectance of less than or equal to 1% over a majority of an angle of incidence range of 0° to 55° for radiation incident on the anti-reflection layer. In an embodiment, the anti-reflection layer has average reflectance (over the range of 500-800 nm) of less than or equal to 0.4% over a majority (e.g., all) of the angle of incidence range of 0° to 55° for radiation incident on the anti-reflection layer. Examples of the reflectance of an embodiment of the anti-reflection layer produced by the process of FIG. 9 are shown in FIGS. 11 and 12. FIG. 11 is a graph of reflectance (along the vertical axis in terms of percentage) against wavelength of radiation (along the horizontal axis in terms of nanometers) incident on an anti-reflection coating according to an embodiment. Line 1100 corresponds to the results for radiation provided at an incidence angle of 45 degrees at an embodiment of anti-reflection layer and line 1110 corresponds to the results for radiation provided at an incidence angle of 8 degrees at an embodiment of anti-reflection layer. FIG. 12 is a graph of average reflectance (over the range of 500-800 nm and along the vertical axis in terms of percentage) against incident angle of radiation (along the horizontal axis in terms of degrees) on an anti-reflection coating according to an embodiment. Line 1200 corresponds to the results for radiation provided on an embodiment of the anti-reflection layer produced by the process of FIG. 9 and line 1210 corresponds to the results for a comparison thin film anti-reflection layer produced by a conventional vapor deposition process.

So, in an embodiment, the combination of the two mixtures and double layer process produces a crack free and striation free coating that has low reflectivity in the 300-1000 nm wavelength range.

The anti-reflection coating described herein can have various applications. For example, it can be applied to an object that is part of, or provided in or with, a lithographic apparatus (including any optical metrology apparatus therein such as the alignment sensor AS, level sensor LS, interferometer IF, etc.) as described herein, an inspection apparatus as described herein (such as any of the elements of FIGS. 3, 4 and 6), any articles for use with any of the apparatus described herein (e.g., a device substrate, a patterning device, etc.)

One such application is to reduce ghost images or reflections. Multiple reflections from parallel surfaces in optical assemblies contribute to ghost images or reflections that are detected even after a conventional anti-reflection coating is used. To help reduce such ghost images or reflections, surfaces can be tilted/wedged to reduce unwanted reflection, but which adds to fabrication cost. A graded index anti-reflection coating such as provided herein with better performance over wavelength and angle of incidence than a typical physical vapor deposition broadband anti-reflection coating, can improve performance by reducing ghost images or reflections. Moreover, due to low reflectivity over a broad wavelength range and at higher angles of incidence, the anti-reflection coating provided herein can be used to eliminate tilted/wedged surfaces that are used to reduce ghost images or reflections. So, the anti-reflection coating provided herein can be used to reduce or eliminate ghost images or reflections in an inspection apparatus and/or alignment sensor as described herein.

Another such application is to reduce unwanted radiation from high angle of incidence surfaces. For example, radiation can become on surfaces at high angle of incidence in high numerical aperture optical systems (e.g., numerical aperture of 0.5 or greater). So, a graded index anti-reflection coating such as provided herein can provide a lower reflectance over a higher angle of incidence range possible in such high numerical aperture system. Hence the graded index anti-reflection coating described herein can provide improved performance of an objective over higher numerical apertures. Additionally or alternatively, the graded index anti-reflection coating described herein can provide improved performance of an objective for different polarizations. As a specific example, the graded index anti-reflection coating described herein can provide improved performance for higher angles of incidence for lens elements in high numerical objective sensor objectives (such as in an inspection apparatus or alignment sensor as described herein).

While the description has focused on objects used in a patterning process or any of its apparatuses, it will be appreciated that the anti-reflection coating described herein can be used for other applications and thus the term object should not considered as limited to structures used in a patterning process or any of its apparatuses. Further, while the description has focused on the use of anti-reflection coatings to help prevent unwanted radiation, anti-reflection coatings can have other purposes and so the anti-reflection coatings herein are not limited to the purposes of preventing unwanted radiation.

In an embodiment, there is provided a method of forming an anti-reflection layer, the method comprising: applying a first mixture to an object, the first mixture made from a combination comprising aluminum tri-sec-butoxide (ATSB), a first chelating agent, water and an alcohol; removing a majority of the alcohol from the applied first mixture; after the removing, applying a second mixture to the object, the second mixture made from a combination comprising aluminum tri-sec-butoxide, a second chelating agent different than the first chelating agent, water and an alcohol; and removing a majority of the alcohol from the applied second mixture, wherein the applied first and second mixtures are used to form the anti-reflection layer.

In an embodiment, the method further comprises exposing the applied first and second mixtures to water at a temperature of at least 50° C. In an embodiment, the first or second chelating agent comprises acetylacetone (AcAcH). In an embodiment, the first or second chelating agent comprises ethyl acetoacetate (EAA). In an embodiment, the first chelating agent comprises acetylacetone (AcAcH) and the second chelating agent comprises ethyl acetoacetate (EAA). In an embodiment, the ATSB to water molar ratio is selected from about 1:2 to about 1:4. In an embodiment, the alcohol is isopropyl alcohol (IPA). In an embodiment, the anti-reflection layer has a thickness of at least 300 nm. In an embodiment, the anti-reflection layer has a reflectance of less than or equal to 1%. In an embodiment, the anti-reflection layer has the reflectance of less than or equal to 0.3% over a majority of the wavelength range of 300 nm to 1200 nm at normal incidence. In an embodiment, the anti-reflection layer has an average reflectance over the range of 500-800 nm wavelength radiation of less than or equal to 0.4% over a majority of an angle of incidence range of 0° to 45° for radiation incident on the anti-reflection layer. In an embodiment, the alcohol is isopropyl alcohol (IPA), the first or second chelating agent is acetylacetone (AcAcH) and the ATSB to water molar ratio is selected from about 1:2 to about 1:4. In an embodiment, the alcohol is isopropyl alcohol (IPA), the first or second chelating agent is ethyl acetoacetate (EAA) and the ATSB to water molar ratio is selected from about 1:2 to about 1:4. In an embodiment, the object comprises fused silica.

In an embodiment, there is provided an object having an anti-reflection layer made according to a method as described herein.

Although specific reference may be made in this text to the use of apparatus for the manufacture of devices, it should be understood that the apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

An embodiment of the invention may take the form of a computer program containing one or more sequences of machine-readable instructions to cause performance of a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

One or more aspects disclosed herein may be implemented in a control system. Any control system described herein may each or in combination be operable when the one or more computer programs are read by one or more computer processors located within at least one component of an apparatus. The control systems may each or in combination have any suitable configuration for receiving, processing, and sending signals. One or more processors are configured to communicate with the at least one of the control systems. For example, each control system may include one or more processors for executing the computer programs that include machine-readable instructions for the methods described above. The control systems may include data storage medium for storing such computer programs, and/or hardware to receive such medium. So the control system(s) may operate according the machine readable instructions of one or more computer programs.

Although specific reference may have been made above to the use of embodiments in the context of optical system, it will be appreciated that embodiments of the invention may be used in other applications. For example, embodiments may be with imprint lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The present description has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The foregoing description of the specific embodiments reveals the general nature of embodiments of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The descriptions above are intended to be illustrative, not limiting. Thus, it will be apparent to one skilled in the art that modifications may be made to the disclosure as described without departing from the scope of the claims set out below and the breadth and scope of the present invention should not be limited by any of the above-described exemplary embodiments, but should be defined only in accordance with the following claims and their equivalents.

The invention claimed is:

1. A method of forming an anti-reflection layer, the method comprising:
   applying a first mixture to an object, the first mixture comprising aluminum tri-sec-butoxide (ATSB), a first chelating agent, water and an alcohol;
   removing a majority of the alcohol from the applied first mixture;
   after the removing, applying a second mixture to the object, the second mixture comprising ATSB, a second chelating agent different than the first chelating agent, water and additional alcohol;
   removing a majority of the alcohol from the applied second mixture;
   applying water to the first and second mixtures on the object; and
   drying the object with the applied first and second mixtures,
   wherein the applied first and second mixtures are used to form the anti-reflection layer.

2. The method of claim 1, wherein applying water comprises exposing the applied first and second mixtures to the water at a temperature of at least 50° C.

3. The method of claim 1, wherein the first or second chelating agent comprises acetylacetone (AcAcH).

4. The method of claim 1, wherein the first or second chelating agent comprises ethyl acetoacetate (EAA).

5. The method of claim 4, wherein the first chelating agent comprises acetylacetone (AcAcH) and the second chelating agent comprises ethyl acetoacetate (EAA).

6. The method of claim 1, wherein the ATSB to water molar ratio is selected from about 1:2 to about 1:4.

7. The method of claim 1, wherein the alcohol is isopropyl alcohol (IPA).

8. The method of claim 1, wherein the anti-reflection layer has a thickness of at least 300 nm.

9. The method of claim 1, wherein the anti-reflection layer has a reflectance of less than or equal to 1% over a majority of the wavelength range of 300 nm to 1200 nm at normal incidence.

10. The method of claim 9, wherein the anti-reflection layer has a reflectance of less than or equal to 0.3% over a majority of the wavelength range of 300 nm to 1200 nm at normal incidence.

11. The method of claim 9, wherein the anti-reflection layer has an average reflectance over the range of 500-800 nm wavelength radiation of less than or equal to 0.4% over a majority of an angle of incidence range of 0° to 45° for radiation incident on the anti-reflection layer.

12. The method of claim 1, wherein the alcohol is isopropyl alcohol (IPA), the first or second chelating agent is acetylacetone (AcAcH) and the ATSB to water molar ratio is selected from about 1:2 to about 1:4.

13. The method of claim 1, wherein the alcohol is isopropyl alcohol (IPA), the first or second chelating agent is ethyl acetoacetate (EAA) and the ATSB to water molar ratio is selected from about 1:2 to about 1:4.

14. The method of claim 1, wherein the applying the first mixture to the object comprises applying the first mixture to fused silica.

15. An object having an anti-reflection layer, formed according to the method of claim 1.

\* \* \* \* \*

UNITED STATES PATENT AND TRADEMARK OFFICE
CERTIFICATE OF CORRECTION

| | |
|---|---|
| PATENT NO. | : 11,422,289 B2 |
| APPLICATION NO. | : 16/500546 |
| DATED | : August 23, 2022 |
| INVENTOR(S) | : Kelkar et al. |

It is certified that error appears in the above-identified patent and that said Letters Patent is hereby corrected as shown below:

In the Specification

In Column 3, Line 46, delete "a the" and insert -- the --, therefor.

In Column 4, Line 60, delete "minor" and insert -- mirror --, therefor.

In Column 4, Line 63, delete "minors" and insert -- mirrors --, therefor.

In Column 5, Line 4, delete "(minors)." and insert -- (mirrors). --, therefor.

In Column 7, Line 61, delete "minor" and insert -- mirror --, therefor.

In Column 10, Line 44, delete "FIG." and insert -- FIGS. --, therefor.

Signed and Sealed this
Eighteenth Day of June, 2024

Katherine Kelly Vidal
*Director of the United States Patent and Trademark Office*